United States Patent [19]

Kosuge

[11] Patent Number: 5,047,987
[45] Date of Patent: Sep. 10, 1991

[54] LOW VOLTAGE INHIBIT CONTROL APPARATUS

[75] Inventor: Masahiro Kosuge, Kawasaki, Japan

[73] Assignee: Motorola Inc., Schaumburg, Ill.

[21] Appl. No.: 438,901

[22] Filed: Nov. 17, 1989

[30] Foreign Application Priority Data

Nov. 21, 1988 [JP] Japan ................................. 63-292509

[51] Int. Cl.$^5$ ....................... G06F 11/30; G06F 13/12
[52] U.S. Cl. .................................... 365/228; 365/226;
371/66; 364/280.2; 364/975.2; 340/663;
307/66; 361/92
[58] Field of Search ..................... 361/92; 340/663;
307/66; 364/280.2, 975.2; 365/228; 371/66;
365/226

[56] References Cited

U.S. PATENT DOCUMENTS

| | | | |
|---|---|---|---|
| 3,624,617 | 11/1971 | Putterman et al. | 340/663 |
| 4,307,455 | 12/1981 | Juhasz et al. | 371/66 |
| 4,534,018 | 8/1985 | Eckert et al. | 365/228 |
| 4,747,057 | 5/1988 | DiGiulia et al. | 364/200.2 |

FOREIGN PATENT DOCUMENTS 0140840 11/1979 Japan ..................................... 371/66

Primary Examiner—Steven L. Stephan
Assistant Examiner—Thomas M. Dougherty

[57] ABSTRACT

Low voltage inhibit control apparatus used in conjunction with a microprocessor system having a power supply, comprising a low voltage inhibit circuit providing a power down reset signal in response to the voltage dropping of the power supply, and control circuitry for preventing the power down reset signals from being supplied to the microprocessor system in response to receiving DATA and WRITE signals from the microprocessor.

8 Claims, 3 Drawing Sheets

LOW VOLTAGE INHIBIT CONTROL APPARATUS

FIELD OF THE INVENTION

The present invention relates, in general, to low voltage inhibit control apparatus used in conjunction with microprocessors and the like. More particularly, the present invention relates to control circuitry for controlling a low voltage inhibit circuit to allow certain functions within the microprocessor system to be completed by preventing resetting even when power supply voltage becomes low.

BACKGROUND OF THE INVENTION

In the prior art it is common practice to include a low voltage inhibit circuit in microprocessor systems, for the purpose of preventing malfunction when a power voltage is low. The low voltage inhibit circuit is connected to the microprocessor power supply and sends a reset signal directly to the microprocessor whenever the voltage supplied by the power supply drops below a predetermined value.

The problems that arise with the above described structure is that data being transferred into a memory within the microprocessor can be interrupted at a midpoint in the transfer, resulting in erroneous data being stored in the memory. Further, it is often necessary to perform tests on the microprocessor circuits and system and it is desirable to allow continued operation at low voltage.

SUMMARY OF THE INVENTION

Accordingly, it is an object of the present invention to provide low voltage inhibit control apparatus used in conjunction with microprocessors and the like.

More particularly, it is an object of the present invention to provide such low voltage inhibit control apparatus including a low voltage inhibit circuit and control circuitry for controlling a reset signal from the low voltage inhibit circuit to allow continuous performing of the microprocessor at low voltage.

Yet another object of the present invention is to provide a method for controlling the reset signal from the low voltage inhibit circuit.

The foregoing and other objects are achieved in the present invention wherein there is provided low voltage inhibit control apparatus used in conjunction with a microprocessor system having a power supply, which comprises a low voltage inhibit circuit and control circuitry. The low voltage inhibit circuit is coupled to the power supply for sensing when the power supply output becomes below a predetermined voltage and supplies a power down reset signal in response thereto. The control circuitry is coupled so as to receive the power down reset signal from said low voltage inhibit circuit and further coupled so as to receive a first instruction signal from the microprocessor system, and prevents the received power down reset signal from being supplied to the microprocessor system in response to receiving the first instruction signal and allows the received power down reset signal to be supplied to the microprocessor system when lacking the first instruction signal.

In a specific embodiment of the present invention, the control circuitry comprises a state memory circuit having a first and second state, and an initial state setting circuit coupled to the power supply and to the state memory circuit. The initial state setting circuit sets the initial state of the state memory circuit to the first state when the power supply is turned on. Also, the control circuitry comprises a state inversion control circuit which is coupled so as to receive the power down reset signal from said low voltage inhibit circuit, coupled so as to receive data and write signals from the microprocessor system and further coupled to said state memory circuit. The state inversion control circuit supplies an inversion signal to change the state of said state memory circuit to the second state in response to receiving the data and write signals. The control circuitry further comprises a gate which is coupled to receive the power down reset signal and further coupled to the state memory circuit, and allows the received power down reset signals to be supplied to the microprocessor system in response to the first state of the state memory circuit and prevents the received power down reset signals from being supplied to the microprocessor system in response to the second state of the state memory circuit, whereby the microprocessor may continue to operate without being reset even when the power supply voltage drops low.

These and other objects and advantages will be apparent to one of skill in the art from the detailed description below taken together with the drawings.

DETAILED DESCRIPTION OF THE INVENTION

Figure 1:
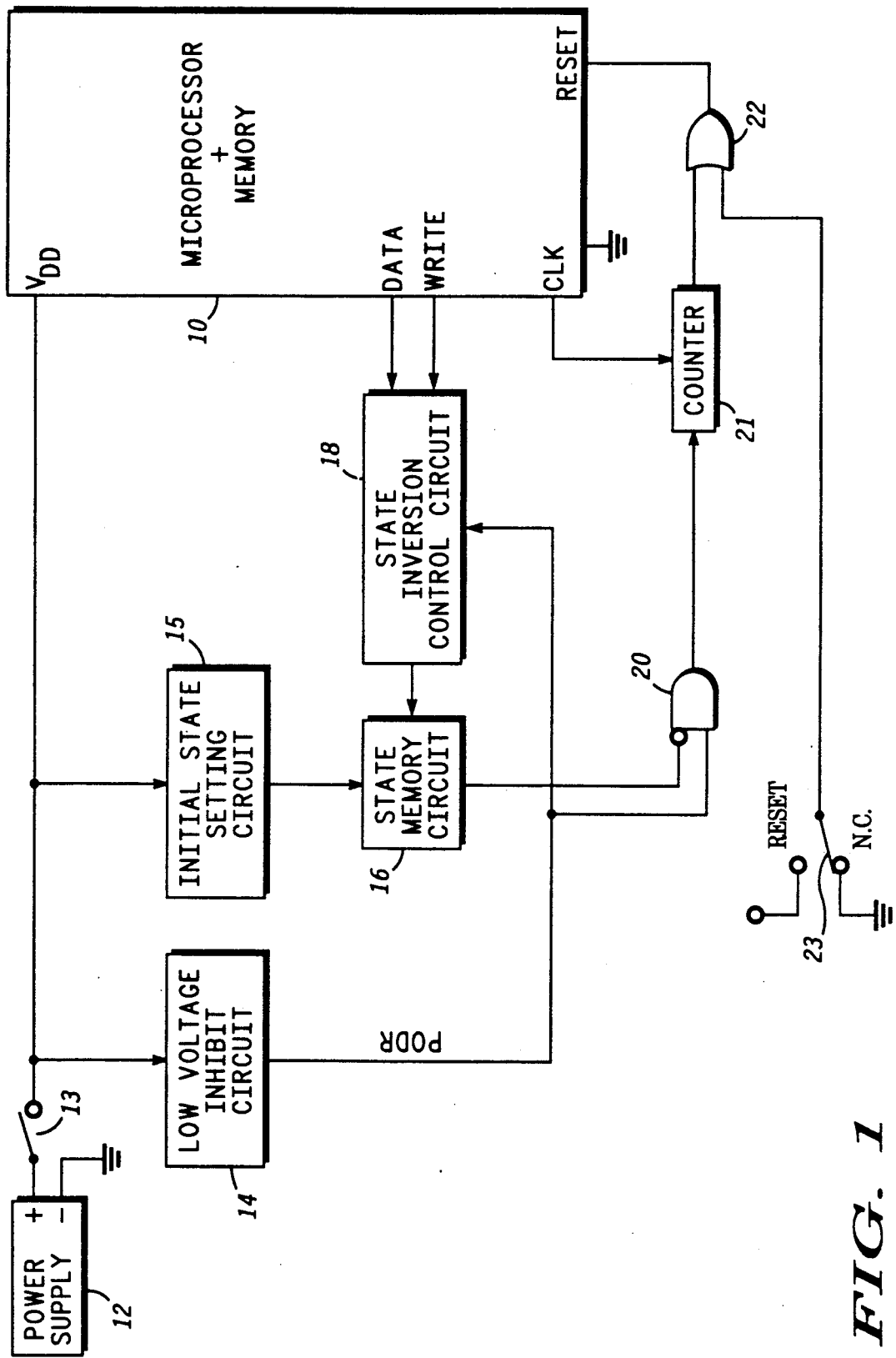
FIG. 1 is a block diagram of a microprocessor system including low voltage inhibit control apparatus embodying the present invention.
Figure 2:
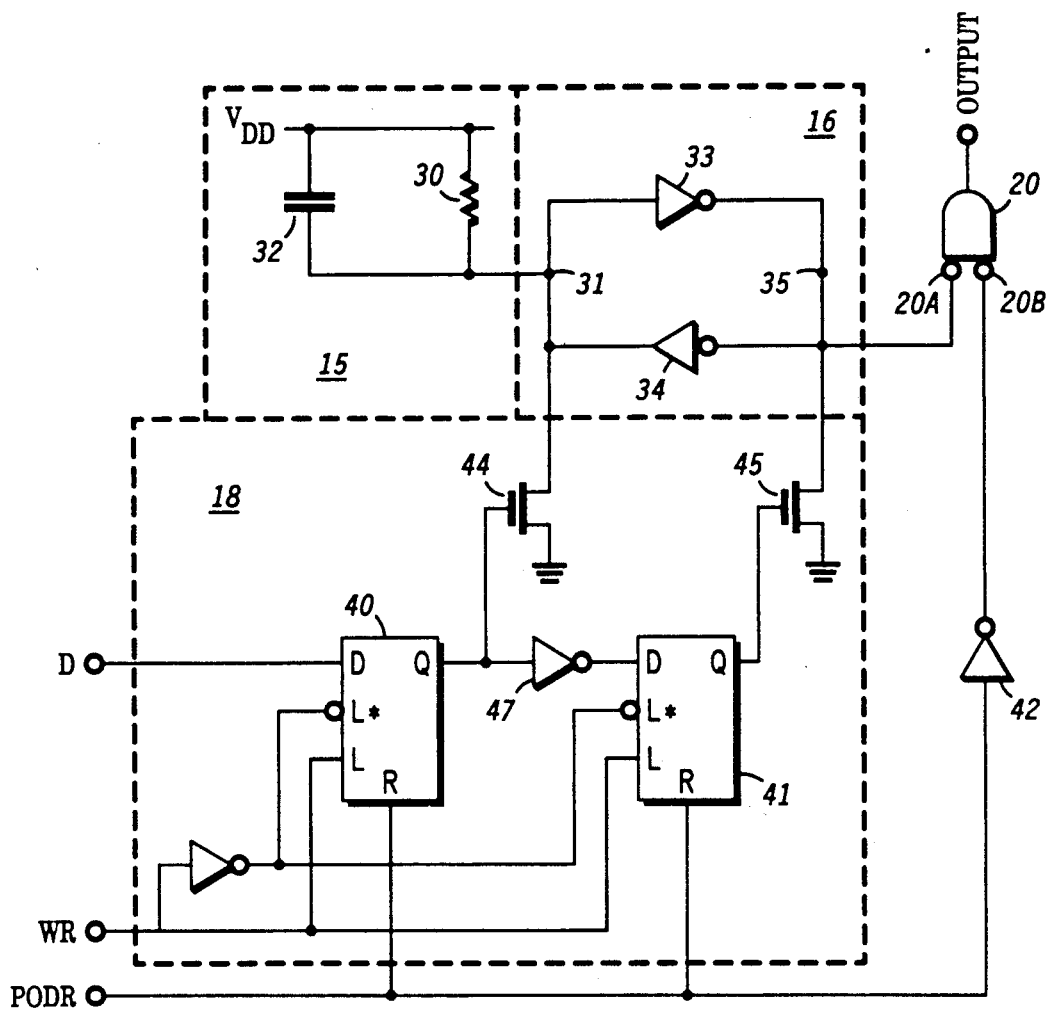
FIG. 2 is a schematic diagram of specific control circuitry used in the system of FIG. 1.
Figure 3:
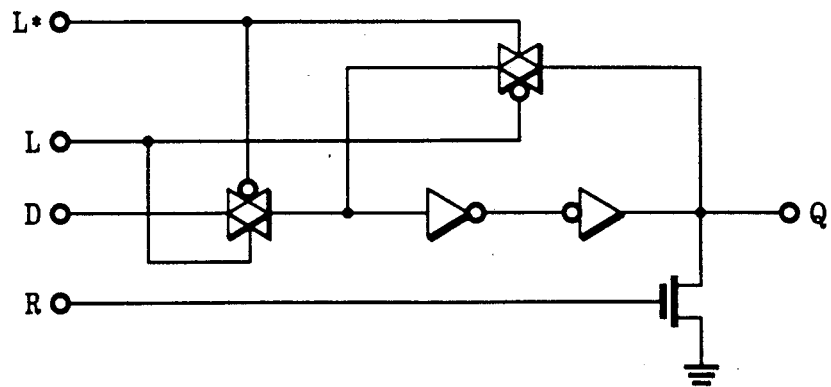
FIG. 3 is a schematic diagram of a typical switch circuit used for 40 and 41 in FIG. 2.

The low voltage inhibit control apparatus according to the present invention will now be described in detail with reference to a preferred embodiment thereof, which is illustrated in FIGS. 1, 2 and 3.

FIG. 1 is a block diagram of a microprocessor system including a low voltage inhibit circuit(LUI) 14 and further including a control circuitry(15,16,18,20) embodying the present invention. A microprocessor 10 includes memories, timer, etc. required in the particular application. A power supply 12 furnishes power at an operating voltage, VDD, to microprocessor 10 and a low voltage inhibit circuit 14 through a power switch 13. Voltage VDD is also supplied to an initial state setting circuit 15 for setting the initial state of the control apparatus. The output signal of circuit 15 is supplied to a state memory circuit 16 for storing the initial state when power supply 12 is initially turned on. A state inversion control circuit 18 is connected to receive DATA and WRITE signals from microprocessor 10 and connected to supply control signals or inversion signals to circuit 16 in response to the reception of predetermined combinations of DATA and WRITE signals. The output signal of circuit 16 is used to enable or disable an AND gate 20 to allow or prevent the passage of a power down reset signal(PODR) from circuit 14 to the microprocessor 10.

It is common practice to supply the reset signal to initiate a counter 21, which also receives clock signals from microprocessor 10. At some predetermined time later, e.g. 4064 clock pulses, counter 21 stops counting, and provides the reset pulse of predetermined length to microprocessor 10 through an OR gate 22. A manual switch 23 may be provided for manually resetting microprocessor 10 through OR gate 22.

FIG. 2 illustrates an embodiment of control circuitry 15, 16, 18 and 20 of FIG. 1 in more concrete form.

In operation, VDD is supplied through a resistor 30 to a junction 31 connected to opposite ends of inverters 33 and 34. Inverters 33 and 34 function as a state memory. A capacitor 32 is connected in parallel with resistor 30 and speeds up operation in the event the output of power supply 12 rises very rapidly. The other ends of inverters 33 and 34 are connected to a second junction 35, which is also connected to the inverted input terminal 20A of AND gate 20. When the output power of power supply 12 (not shown) rises, the potential at junction 31 is pulled up by the potential across resistor 30, and the potential at junction 35 becomes low. The low potential at junction 35 is transmitted to the inverted input terminal 20A of AND gate 20 to open the gate and allow the passage of signals on the second input terminal 20B thereof.

Figure 4A:
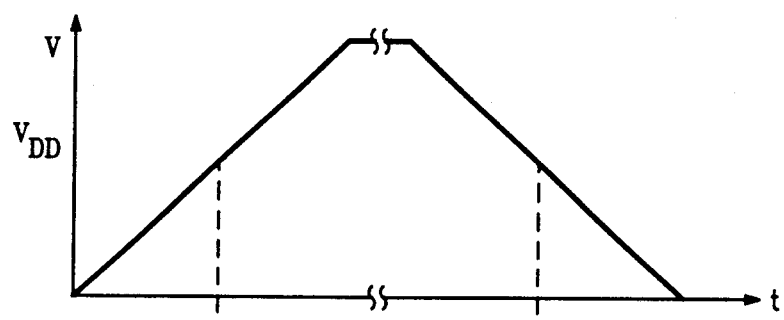
FIGS. 4A-4F are a graphical explanation of the operation of the circuit shown in FIG. 2.
Figure 4B:
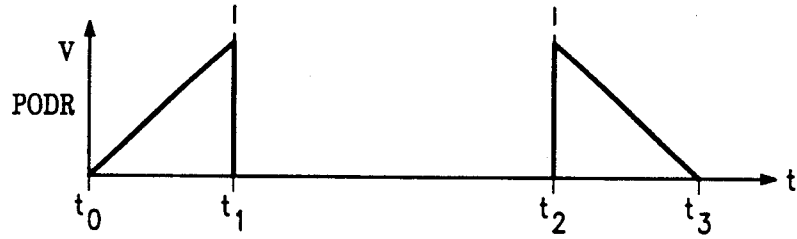
Figure 4C:
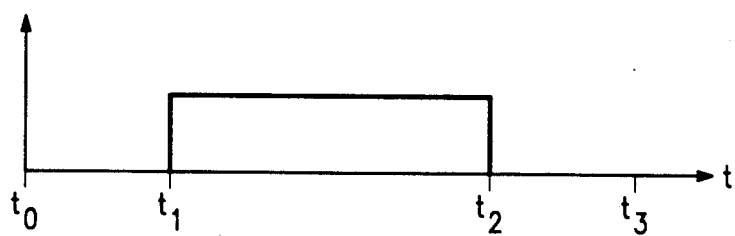

When the voltage VDD supplied from power supply 12 has a shape shown in FIG. 4A, low voltage inhibit circuit 14 provides power down reset (PODR) signals as shown in FIG. 4B. When the voltage VDD remains high (normal operating voltage), the output of low voltage inhibit circuit 14 is logically low (no reset signal). This logical low signal is inverted in an inverter 42 (as shown in FIG. 4C), and fed into the other inverted input terminal 20B of AND gate 20, which provide no reset signal. When the voltage VDD rises to or drops from the normal voltage, low voltage inhibit circuit 14 outputs PODR signals (from t0 to t1, from t2 to t3), which are fed into the reset input terminals of a pair of dual state switch circuits 40 and 41 functioning as state inversion control circuit 16. Both switch circuit 40 and 41 are reset and their Q outputs are logically low, turning off a pair of field effect transistors (FETs) 44 and 45. In this initialized mode, the state of inverters 33 and 34 remains unchanged as described above (the first state). The PODR signal is also supplied through inverter 42 to inverted input terminal 20B of AND gate 20, which provides a reset signal to microprocessor 10.

Switch circuit 40 has a D input terminal connected to receive data signals from microprocessor 10. A Q output terminal of switch circuit 40 is connected through an inverter 47 to a D input terminal of switch circuit 41, so that switch circuits 40 and 41 are always in opposite modes (except in the initialized mode after resetting). Each of switch circuits 40 and 41 has an L input terminal connected to receive WRITE signals from microprocessor 10, and further has an L* input terminal connected to receive inverted WRITE signals. When switch circuits 40 and 41 do not receive the WRITE signal, they remain unchanged because they can not receive the DATA signal. When switch circuits 40 receive the WRITE signal, they can be changed or rewritten in accordance with received DATA signal. One preferable example of such switch circuit is shown in FIG. 3. In this specific example, when the WRITE signal is logically low, the switch circuit remains unchanged. When the WRITE signal is logically high, the switch circuit can be rewritten and its Q output changes depending on the DATA signal. However, it will of course be understood that through the use of inverters, various predetermined combinations of DATA and WRITE signals may provide different results. Therefore, the expressions as "receiving signal", "receiving a data signal" and "receiving data and write signals", etc. used herein should be interpreted to include any signal states and any combinations of two signals which are predetermined in order to control the PODR signals with no limiting sense.

As one example, in the specific embodiment illustrated, the various signals produce the results set forth in the following table.

TABLE

| | UDD | WRITE | DATA | PODR | SW40 | SW41 | NODE35 | MP |
|---|---|---|---|---|---|---|---|---|
| #1 | HIGH | L | X | L | L | L | L | — |
| | LOW | L | X | H | L | L | L | RESET |
| #2 | HIGH | H | L | L | L | H | L | — |
| | LOW | L | X | H | L | L | L | RESET |
| #3 | HIGH | H | H | L | H | L | H | — |
| | LOW | X | H | H | L | L | H | NO RESET |

The following situations are illustrated in the above table and FIG. 4.

Power supply 12 is initially turned on and voltage UDD rises to normal high level, as shown in the left side in FIG. 4A. The potential at junction 31 is pulled up due to the rising of voltage UDD, and the logic level at junction or node 35 is low. At this initializing time, low voltage inhibit circuit 14 supplies PODR signals (power on reset signal at this time), which resets switch circuits 40 and 41 and makes their Q outputs logically low. Accordingly, FETs 44 and 45 turn off and this maintains the state (the first state) of inverters 33 and 34. Node 35 stays logically low, and opens AND gate 20.

In situation #1, the WRITE signal supplied from the microprocessor is low, and switch circuits 40 and 41 are not rewritten irrespective of the DATA signal. Even if the DATA signal is high, the DATA signal can not be read by the switch circuits because of the low level of the WRITE signal. A condition expressed as "lacking (data) signal" includes the condition that the DATA signal is low and also includes the condition that the WRITE signal is low. The Q outputs of both switch circuit remain logically low and keep FETs 44 and 45 off. Therefore, node 35 is logically low, and AND gate 20 is still open.

Figure 4D:
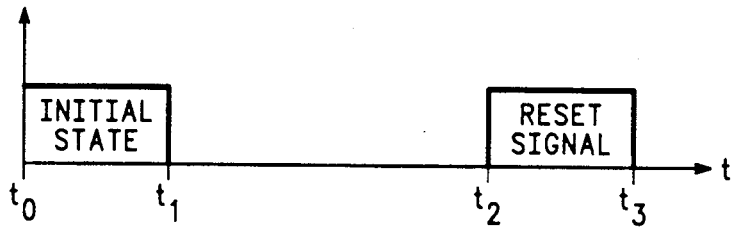

Then, if UDD drops to an abnormal low level as shown in the right side of FIG. 4A, low voltage inhibit circuit 14 generates a PODR signal (power down reset signal at this time). The power on reset signal and power down reset signal are substantially the same in this embodiment, but they may be different from each other. The PODR signal resets switch circuit 40 and 41, and therefore maintains node 35 logically low to keep AND gate 20 open. The PODR signal is also fed to inverter 42 where it is inverted and transmitted to AND gate 20, and the PODR signal can pass through gate 20 toward the microprocessor to reset it. This situation is shown in FIG. 4D.

In situation #2, while voltage VDD is at high level, the microprocessor supplies a logically high WRITE signal to switch circuits 40 and 41 to enable them to be written. Because the DATA signal is logically low at that time, the Q output of switch circuit 40 remains logically low and the Q output of switch circuit 41 is changed to logically high. Accordingly, FET 44 is still off and FET 45 turns on to connect node 35 to the ground. In situation #2, although the WRITE signal is high, the state of state memory circuit 16 (inverters 33 and 34) remains unchanged (node 35 is low). This is due to the low level of the DATA signal, and therefore this condition should be considered to be included within such a condition as expressed like "lacking (data) signal". AND gate 20 is still open.

Figure 4E:
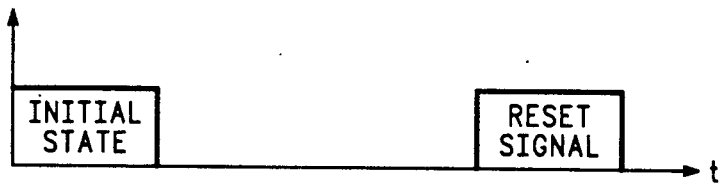

Then, if VDD drops to a low level, the PODR signal resets switch circuit 40 and 41 and causes their Q output to be logically low. Node 35 is maintained logically low to keep AND gate 20 open. Therefore, the PODR signal passes through gate 20 and resets the microprocessor. This situation is shown in FIG. 4E.

In situation #3, while voltage VDD is at high level, a logically high WRITE signal is received by switch circuits 40 and 41 similar to situation #2. This situation #3 differs from #2 in that a logically high DATA signal is also received. Consequently, the Q output of switch circuit 40 is changed to logically high and the Q output of switch circuit 41 is changed to logically low. That makes FET 44 turn on and FET 45 turn off. Then node 31 is connected to the ground and node 35 gets off the ground. The state of state memory circuit 16 is inverted (node 35 becomes high), and AND gate 20 is closed.

Figure 4F:

Then, when VDD drops to a low level, the PODR signal resets switch circuits 40 and 41 and makes nodes 31 and 35 off the ground. Because node 35 has been already at high level, it remains unchanged at a logically high level and keeps AND gate 20 closed. Therefore, the PODR signal can not pass through gate 20, and therefore the microprocessor is not reset. This situation is shown in FIG. 4F. Thus, various low voltage tests can be performed on microprocessor 10 or data storage can be completed. After testing or data storing, the PODR signal can be effective by initializing the control circuitry or writing a low DATA signal to switch circuits 40 and 41.

ADVANTAGE

A low voltage inhibit control apparatus according to the present invention can control the application of PODR reset signals to a microprocessor system in response to predetermined signals from the microprocessor. Thus, by applying appropriately selected signals to the control apparatus, low voltage tests can be performed on the microprocessor system. Also, data storage functions can be completed before the microprocessor is reset by the PODR reset signal. Other functions may also be performed by those skilled in the art by simply selecting appropriate WRITE and DATA signals from the microprocessor.

While the present invention has been shown and described with reference to a particular embodiment thereof, various modifications and changes thereto will be apparent to those skilled in the art and are within the spirit and scope of the present invention. Specifically, although the present control apparatus is illustrated as separate components, it will understood that the control apparatus may be integrated as a portion of the microprocessor for convenience and size.

I claim:

1. In conjuction with a microprocessor system having a power supply, low voltage inhibit control apparatus comprising:
    a low voltage inhibit circuit coupled to the power supply for sensing when the power supply output becomes below a predetermined voltage and supplying a power down reset signal in response thereto; and
    control circuitry coupled so as to receive the power down reset signal from said low voltage inhibit circuit and further coupled so as to receive a first instruction signal from the microprocessor system, for preventing the received power down reset signals from being supplied to the microprocessor system in response to receiving the first instruction signal and allowing the received power down reset signals to be supplied to the microprocessor system when lacking the first instruction signal.

2. In conjuction with a microprocessor system having a power supply, low voltage inhibit control apparatus as claimed in claim 1, wherein the first instruction signal is a data signal.

3. In conjunction with a microprocessor system having a power supply, low voltage inhibit control apparatus as claimed in claim 1, wherein the control circuitry comprises a gate including,
    a first input terminal connected to receive the power down reset signals,
    a second input terminal connected to receive the first instruction signal applied thereto, and
    an output terminal connected to supply the power down reset signals to the microprocessor system when lacking the first instruction signal to said second input terminal.

4. In conjunction with a microprocessor system having a power supply, low voltage inhibit control apparatus comprising:
    a low voltage inhibit circuit coupled to the power supply for sensing when the power supply output becomes below a predetermined voltage and supplying a power down reset signal in response thereto; and
    control circuitry coupled so as to receive the power down reset signal from said low voltage inhibit circuit and further coupled so as to receive a first and second instruction signal from the microprocessor system, for preventing the received power down reset signals from being supplied to the microprocessor system in response to receiving the first and second instruction signals and allowing the received power down reset signals to be supplied to the microprocessor system when at least one of the first and second instruction signals.

5. In conjunction with a microprocessor system having a power supply, low voltage inhibit control apparatus as claimed in claim 4, wherein the first instruction signal is a data signal, and the second instruction signal is a write signal.

6. In conjunction with a microprocessor system having a power supply, low voltage inhibit control apparatus as claimed in claim 5, wherein the control circuitry further comprises,
    a state memory circuit having a first and second state,
    an initial state setting circuit coupled to the power supply and to said state memory circuit, for setting the initial state of said state memory circuit to the first state when the power supply is turned on, a state inversion control circuit coupled to said state memory circuit and further coupled so as to receive the data signal and the write signal from the microprocessor system, for determining the state of said state memory circuit in accordance with the received data and write signals, and gate means coupled to receive the power down reset signal and further coupled to the state memory circuit, for allowing the received power down reset signals to be supplied to the microprocessor system in response to the first state of the state memory circuit and preventing the received power down reset signals from being supplied to the microprocessor system in response to the second state of the state memory circuit.

7. In conjunction with a microprocessor system having a power supply, low voltage inhibit control apparatus as claimed in claim 6, wherein said state inversion control circuit sets the state of the state memory circuit to the second state in response to receiving the data and write signals.

8. In conjunction with a microprocessor system having a power supply and a low voltage inhibit circuit, a method of controlling the reset of the microprocessor system in accordance with first and second instruction signals supplied by the microprocessor system, comprising the steps of:

sensing by the low voltage inhibit circuit when the power supply output becomes below a predetermined voltage and supplying a power down reset signal in response thereto;

receiving the power down reset signal from said low voltage inhibit circuit and receiving the first and second instruction signals from the microprocessor system; and allowing the received power down reset signals to be supplied to the microprocessor system in response to a first mode of the first and second instruction signals, and preventing the received power down reset signals from being supplied to the microprocessor system in response to a second mode of the first and second instruction signals.

* * * * *